(12) United States Patent
Azmat et al.

(10) Patent No.: US 9,748,238 B2
(45) Date of Patent: *Aug. 29, 2017

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Raheel Azmat, Suwon-si (KR); Sharma Deepak, Suwon-si (KR); Chulhong Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/206,610

(22) Filed: Jul. 11, 2016

(65) Prior Publication Data

US 2016/0322355 A1 Nov. 3, 2016

Related U.S. Application Data

(63) Continuation of application No. 14/736,441, filed on Jun. 11, 2015, now Pat. No. 9,418,990.

(30) Foreign Application Priority Data

Oct. 1, 2014 (KR) ........................ 10-2014-0132459

(51) Int. Cl.
*H01L 27/08* (2006.01)
*H01L 27/088* (2006.01)
(Continued)

(52) U.S. Cl.
CPC .. *H01L 27/0886* (2013.01); *H01L 21/823821* (2013.01); *H01L 23/528* (2013.01);
(Continued)

(58) Field of Classification Search
None
See application file for complete search history.

(56) References Cited

U.S. PATENT DOCUMENTS

| 4,929,567 A | 5/1990 | Park et al. |
| 6,121,078 A | 9/2000 | DeBrosse et al. |

(Continued)

FOREIGN PATENT DOCUMENTS

| JP | H09-092724 A | 4/1997 |
| JP | 2003-007831 A | 1/2003 |
| JP | 2005-229061 A | 8/2005 |

*Primary Examiner* — Michael Lebentritt
(74) *Attorney, Agent, or Firm* — Harness, Dickey & Pierce P.L.C.

(57) ABSTRACT

A semiconductor device, and a method of manufacturing the same, includes first and second gate structures extending in a first direction and spaced apart from each other in a second direction intersecting the first direction, a dummy gate structure provided between the first and second gate structures, a first source/drain region between the first gate structure and the dummy gate structure, a second source/drain region between the second gate structure and the dummy gate structure, a connection contact provided on the dummy gate structure, and a common conductive line provided on the connection contact. The dummy gate structure extends in the first direction. The connection contact extends in the second direction to connect the first source/drain region to the second source/drain region. The common conductive line configured to a voltage to the first and second source/drain regions through the connection contact.

20 Claims, 16 Drawing Sheets

(51) Int. Cl.

| | | |
|---|---|---|
| *H01L 21/8238* | (2006.01) | |
| *H01L 27/02* | (2006.01) | |
| *H01L 23/522* | (2006.01) | |
| *H01L 23/528* | (2006.01) | |
| *H01L 29/06* | (2006.01) | |
| *H01L 29/08* | (2006.01) | |
| *H01L 27/118* | (2006.01) | |
| *H01L 21/8234* | (2006.01) | |
| *H01L 27/092* | (2006.01) | |

(52) U.S. Cl.
CPC ...... *H01L 23/5226* (2013.01); *H01L 27/0207* (2013.01); *H01L 27/088* (2013.01); *H01L 29/0649* (2013.01); *H01L 29/0847* (2013.01); *H01L 21/823431* (2013.01); *H01L 27/0924* (2013.01); *H01L 27/11807* (2013.01); *H01L 2027/11829* (2013.01); *H01L 2027/11875* (2013.01)

(56) References Cited

U.S. PATENT DOCUMENTS

| | | |
|---|---|---|
| 6,410,972 B1 | 6/2002 | Sei et al. |
| 6,885,071 B2 | 4/2005 | Umemoto et al. |
| 7,266,787 B2 | 9/2007 | Hughes et al. |
| 7,475,375 B2 | 1/2009 | Nakanishi |
| 9,418,990 B2 * | 8/2016 | Azmat .................. H01L 27/088 |
| 2002/0068394 A1 | 6/2002 | Tokushige et al. |
| 2003/0057476 A1 | 3/2003 | Morita et al. |
| 2004/0232444 A1 | 11/2004 | Shimizu |
| 2005/0095779 A1 | 5/2005 | Park et al. |
| 2006/0190893 A1 | 8/2006 | Morton |
| 2010/0127344 A1 | 5/2010 | Wills et al. |
| 2011/0031536 A1 | 2/2011 | Okamoto et al. |
| 2012/0181629 A1 | 7/2012 | Su et al. |
| 2014/0159157 A1 | 6/2014 | Jensen et al. |
| 2016/0071848 A1 | 3/2016 | Sengupta et al. |
| 2016/0093623 A1 | 3/2016 | Luan et al. |

* cited by examiner

SEMICONDUCTOR DEVICE AND METHOD OF MANUFACTURING THE SAME

CROSS-REFERENCE TO RELATED APPLICATION

This is a continuation of U.S. application Ser. No. 14/736,441, filed on Jun. 11, 2015, which claims priority under 35 U.S.C. §119 to Korean Patent Application No. 10-2014-0132459, filed on Oct. 1, 2014, in the Korean Intellectual Property Office, the disclosure of each of which is hereby incorporated by reference in its entirety.

BACKGROUND

Field

Some example embodiments of the inventive concepts relate to a semiconductor device and/or a method of manufacturing the same. More particularly, some example embodiments of the inventive concepts relate to a semiconductor device including a plurality of standard cells and/or a method of manufacturing the same.

Description of Related Art

Semiconductor devices are widely used in an electronic industry because of their small sizes, multi-functional characteristics, and/or low manufacture costs. Semiconductor devices may be categorized as any one of semiconductor memory devices storing logical data, semiconductor logic devices processing operations of logical data, and hybrid semiconductor devices having both the function of the semiconductor memory devices and the function of the semiconductor logic devices. Semiconductor devices with excellent characteristics have been demanded with the development of the semiconductor devices. For example, high-reliable, high-speed, and/or multi-functional semiconductor devices have been increasingly demanded. To satisfy these demands, structures of semiconductor devices have been complicated and semiconductor devices have been highly integrated.

SUMMARY

Some example embodiments of the inventive concepts may provide a semiconductor device capable of reducing a manufacture cost and/or a method of manufacturing the same.

Some example embodiments of the inventive concepts may also provide a semiconductor device capable of being easily manufactured and/or a method of manufacturing the same.

According to some example embodiments, a semiconductor device includes a first gate structure and a second gate structure extending in a first direction and spaced apart from each other in a second direction intersecting the first direction; a dummy gate structure between the first gate structure and the second gate structure and extending in the first direction; a first source/drain region between the first gate structure and the dummy gate structure; a second source/drain region between the second gate structure and the dummy gate structure; a connection contact on the dummy gate structure, the connection contact extending in the second direction to connect the first source/drain region to the second source/drain region; and a common conductive line on the connection contact, the common conductive line configured to apply a voltage to the first and second source/drain regions through the connection contact.

In some example embodiments, the connection contact may include a horizontal extension extending in the second direction; and vertical extensions extending from the horizontal extension to top surfaces of the first and second source/drain regions, respectively. Bottom surfaces of the vertical extensions may be in contact with the first and second source/drain regions, respectively.

In some example embodiments, a bottom surface of the horizontal extension may be in contact with a top surface of the dummy gate structure.

In some example embodiments, the semiconductor device may further include a via-contact between the connection contact and the common conductive line. The common conductive line may be for applying the same voltage to the first and second source/drain regions through the via-contact and the connection contact.

In some example embodiments, the semiconductor device may further include a third source/drain region between the first gate structure and the dummy gate structure, the third source/drain region being spaced apart from the first source/drain region in the first direction; a fourth source/drain region between the second gate structure and the dummy gate structure, the fourth source/drain region spaced apart from the second source/drain region in the first direction; a first contact between the first gate structure and the dummy gate structure, the first contact being in contact with the third source/drain region; and a second contact between the second gate structure and the dummy gate structure, the second contact being in contact with the fourth source/drain region. Top surfaces of the first and second contacts may be disposed at a substantially same level as a top surface of the connection contact.

In some example embodiments, the first contact, the second contact, and the connection contact may include identical materials.

In some example embodiments, the first and second contacts may have bar shapes extending in the first direction, and may be spaced apart from the connection contact in the first direction.

In some example embodiments, each of the first contact, the second contact, and the connection contact may have a width in the second direction, and the width of the connection contact may be greater than the widths of the first and second contacts.

According to other example embodiments, a semiconductor device includes a dummy gate structure on a substrate, the dummy gate structure extending in a first direction; a first pair of transistors at respective opposing sides of the dummy gate structure; a second pair of transistors at the respective opposing sides, the second pair of transistors being adjacent to the first pair of transistors in the first direction; a connection contact on a top surface of the dummy gate structure, the connection contact extending along both sidewalls of the dummy gate structure so as to be connected in common to the first pair of transistors; and a first contact and a second contact at the respective opposing sides. The first and second contacts may be connected to the second pair of transistors, respectively. Top surfaces of the first and second contacts may be disposed at a substantially same level as a top surface of the connection contact.

In some example embodiments, the semiconductor device may further include a plurality of logic cells on the substrate. The plurality of logic cells may include a first logic cell; and a second logic cell spaced apart from the first logic cell in the first direction. The dummy gate structure may intersect the first logic cell and the second logic cell. The first logic cell may include the first pair of transistors, and the second logic cell may include the second pair of transistors.

In some example embodiments, the semiconductor device may further include a via-contact in contact with the top surface of the connection contact; and a common conductive line in contact with a top surface of the via-contact. The common conductive line may apply a drain voltage or a source voltage to the first pair of transistors through the via-contact and the connection contact.

In some example embodiments, the semiconductor device may further include a plurality of logic cells on the substrate, and the plurality of logic cells may include a first logic cell; a second logic cell spaced apart from the first logic cell in a second direction intersecting the first direction; a third logic cell spaced apart from the first logic cell in the first direction; and a fourth logic cell spaced apart from the second logic cell in the first direction. The dummy gate structure may be disposed between the first logic cell and the second logic cell, and between the third logic cell and the fourth logic cell. The first pair of transistors may include a first transistor in the first logic cell; and a second transistor in the second logic cell. The second pair of transistors may include a third transistor in the third logic cell; and a fourth transistor in the fourth logic cell.

In some example embodiments, the semiconductor device may further include a via-contact in contact with the top surface of the connection contact; and a common conductive line in contact with a top surface of the via-contact. The common conductive line may be shared by the first logic cell and the second logic cell.

In some example embodiments, the common conductive line may be configured to apply the same voltage (a drain voltage or a source voltage) to the first and second transistors through the via-contact and the connection contact.

In some embodiments, the first contact, the second contact, and the connection contact may include identical materials.

According to yet some example embodiments, a method of manufacturing a semiconductor device includes forming a dummy gate structure extending in a first direction on a substrate; forming a first pair of transistors spaced apart from each other with the dummy gate structure interposed therebetween; forming a second pair of transistors spaced apart from each other with the dummy gate structure interposed therebetween, the second pair of transistors being adjacent to the first pair of transistors in the first direction; forming an interlayer insulating layer covering the dummy gate structure and the transistors on the substrate; patterning the interlayer insulating layer to form a first hole and a second hole that expose one-terminals respectively included in the second pair of transistors; patterning the interlayer insulating layer to form a third hole exposing a top surface of the dummy gate structure and one-terminals respectively included in the first pair of transistors; and forming a first contact, a second contact, and a connection contact in the first hole, the second hole, and the third hole, respectively. The first hole, the second hole, and the third hole may be formed using different photo masks from each other. Top surfaces of the first contact, the second contact, and the connection contact may be disposed at the same height from the substrate.

According to further example embodiments, a semiconductor device includes first and second gate structures extending in a first direction. The first gate structure is electrically connected to a first source/drain region and a second source/drain region, and the second gate structure is electrically connected to a third source/drain region and a fourth source/drain region. The semiconductor device further includes a connection contact electrically connecting the first source/drain region to the third source/drain region. The connection contact extends in the first direction.

The semiconductor device may further include a dummy gate structure interposed between the first and third source/drain regions, and between the second and fourth source/drain region. The dummy gate structure may extend in the first direction. The connection contact may traverse the dummy gate structure along a second direction, the second direction being substantially perpendicular to the first direction.

The semiconductor device may further include first and second contacts each electrically connected to a respective one of the second and fourth source/drain regions. Upper surfaces of the first and second contacts may be coplanar with an upper surface of the connection contact.

The semiconductor device may further include a common conductive line electrically connected to the first and second gate structures via the connection contact and a respective one of the first and third source/drain regions.

BRIEF DESCRIPTION OF THE DRAWINGS

Example embodiments of the inventive concepts will become more apparent in view of the attached drawings and accompanying detailed description.

DETAILED DESCRIPTION OF THE EXAMPLE EMBODIMENTS

Figure 1:
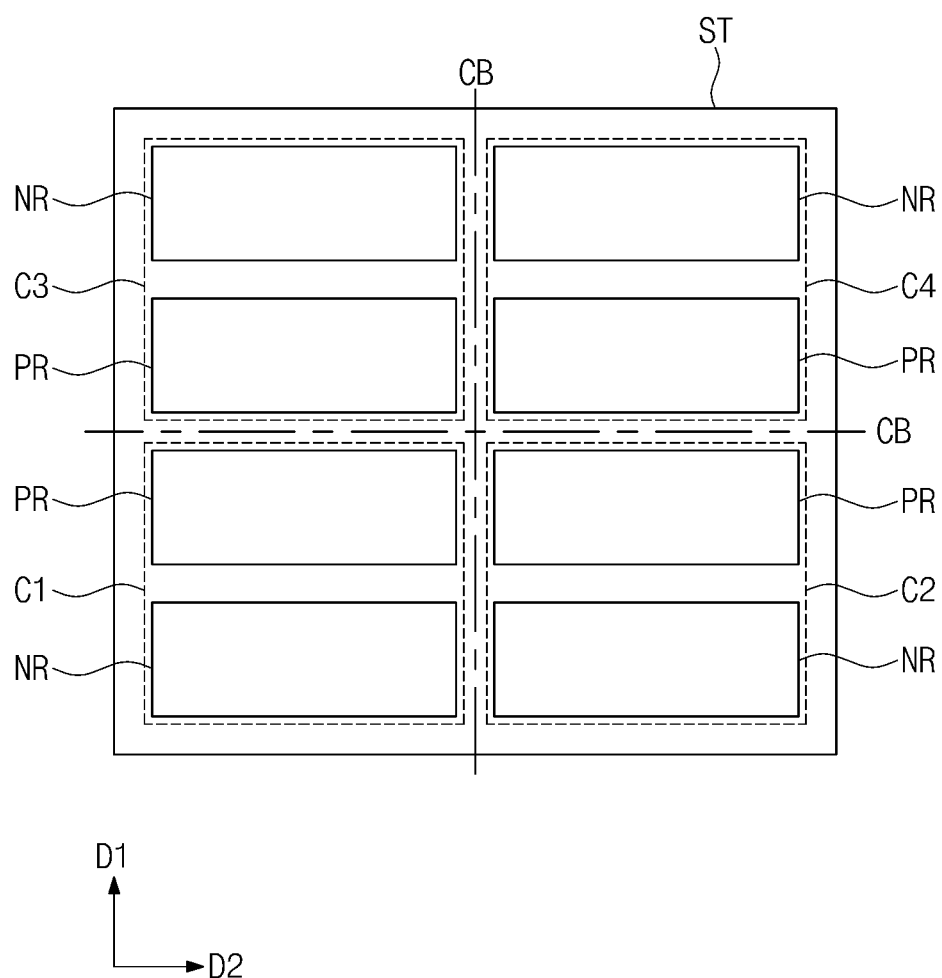
FIG. 1 is a plan view illustrating a semiconductor device according to some example embodiments of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

As appreciated by the present inventive entity, devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

FIG. 1 is a plan view illustrating a semiconductor device according to some example embodiments of the inventive concepts.

Referring to FIG. 1, a semiconductor device according to some example embodiments may include a plurality of logic cells C1, C2, C3, and C4 provided on a substrate. Each of the logic cells C1, C2, C3, and C4 may include a plurality of transistors. In some example embodiments, the semiconductor device may include a first logic cell C1, a third logic cell C3 spaced apart from the first logic cell C1 in a first direction D1, a second logic cell C2 spaced apart from the first logic cell C1 in a second direction D2 intersecting the first direction D1, and a fourth logic cell C4 spaced apart from the third logic cell C3 in the second direction D2. The fourth logic cell C4 may be spaced apart from the second logic cell C2 in the first direction D1. A cell boundary CB may be defined between the logic cells C1, C2, C3, and C4 adjacent to each other.

Each of the logic cells C1, C2, C3, and C4 may include active regions that are separated from each other by a device isolation layer ST. Each of the logic cells C1, C2, C3, and C4 may include a P-type metal-oxide-semiconductor field effect transistor (PMOSFET) region PR and an N-type metal-oxide-semiconductor field effect transistor (NMOSFET) region NR. The PMOSFET region PR and the NMOSFET region NR of each of the logic cells C1, C2, C3, and C4 may be separated from each other by the device isolation layer ST.

In some example embodiments, the PMOSFET region PR and the NMOSFET region NR may be spaced apart from each other in the first direction D1. The PMOSFET region PR of the first logic cell C1 may be adjacent to the PMOSFET region PR of the third logic cell C3 in the first direction D1. In the present specification, the logic cell may be defined as a unit that performs one Boolean logic function (e.g., INVERTER, AND, OR, NAND, or NOR), or one storage function (e.g., FLIP-FLOP). Four logic cells C1, C2, C3, and C4 are illustrated in FIG. 1. However, example embodiments of the inventive concepts are not limited to the number of the logic cells.

Figure 2:
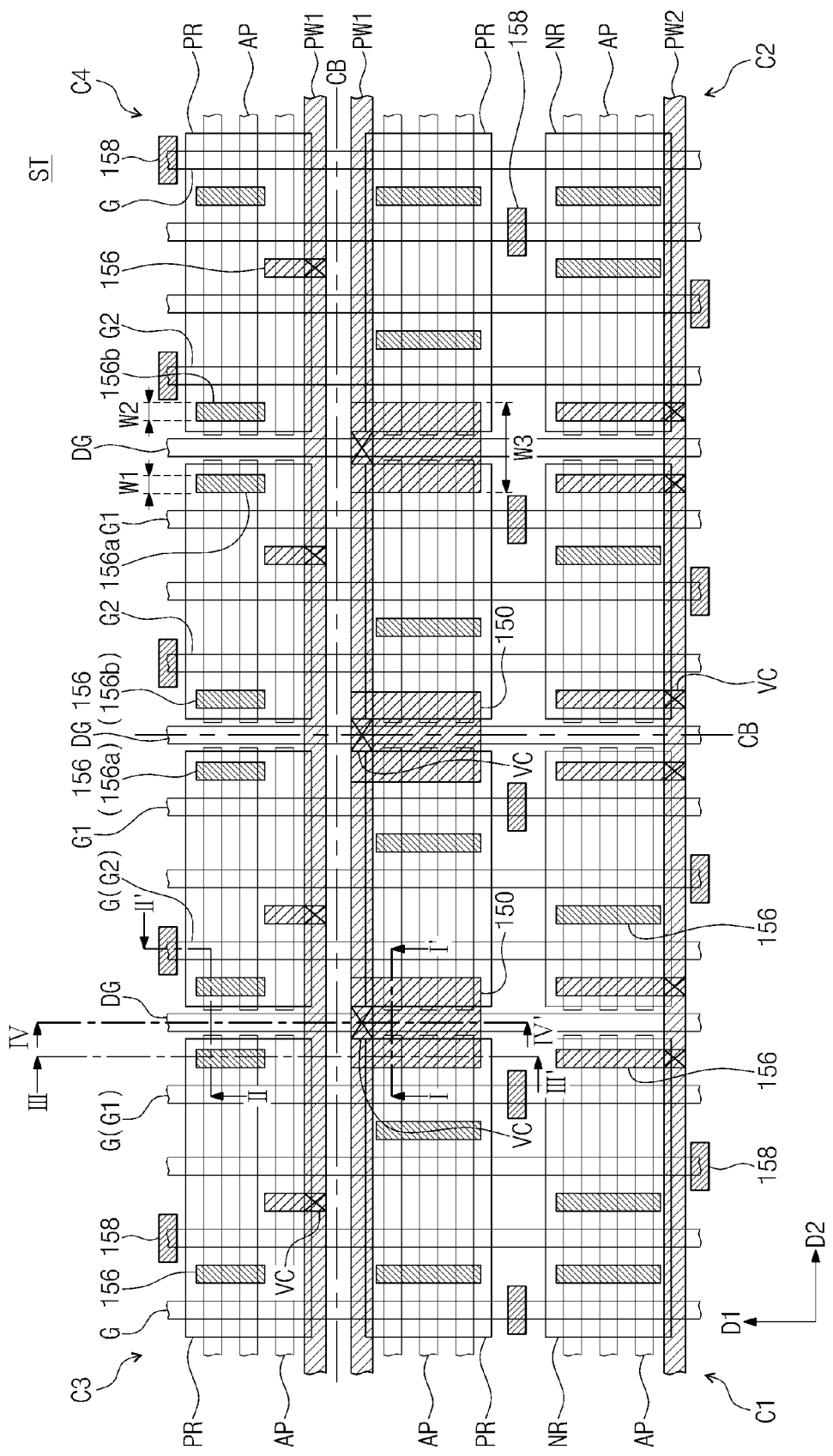
FIG. 2 is a plan view partially illustrating logic cells of FIG. 1.

FIG. 2 is a plan view partially illustrating logic cells of FIG. 1. FIGS. 3A, 3B, 3C, and 3D are cross-sectional views taken along lines I-I', II-II', III-III', and IV-IV' of FIG. 2, respectively.

Hereinafter, example embodiments of the inventive concepts will be described on the basis of the first logic cell C1. However, other logic cells C2, C3, and C4 may have the same structure as, or a corresponding structure to, the first logic cell C1.

Referring to FIGS. 1, 2, 3A, 3B, 3C, and 3D, the first logic cell C1 may include the PMOSFET region PR and the NMOSFET region NR which are separated from each other by the device isolation layer ST. The first logic cell C1 may be separated from other logic cells C2, C3, and C4 adjacent thereto by the device isolation layer ST.

Referring to FIG. 2, the device isolation layer ST may include a first device isolation layer ST1 separating the PMOSFET region PR from the NMOSFET region NR, and a second device isolation layer ST2 separating the first logic cell C1 from the logic cells C2, C3, and C4 adjacent to the first logic cell C1. The first device isolation layer ST1 and the second device isolation layer ST2 may be connected to each other to constitute one united body. The device isolation layer ST may be formed in an upper portion of the substrate 100. For example, the substrate 100 may be a silicon substrate, a germanium substrate, or a silicon-on-insulator (SOI) substrate. The device isolation layer ST may include, for example, a silicon oxide layer.

According to some example embodiments, the PMOSFET region PR and the NMOSFET region NR may be spaced apart from each other in the first direction D1 with the first device isolation layer ST1 interposed therebetween. As illustrated in FIG. 2, each of the PMOSFET region PR and the NMOSFET region NR may be provided in plurality in the first logic cell C1. The plurality of PMOSFET regions PR may be separated from each other by the first device isolation layer ST1, and the plurality of NMOSFET regions NR may also be separated from each other by the first device isolation layer ST1.

Figure 3A:
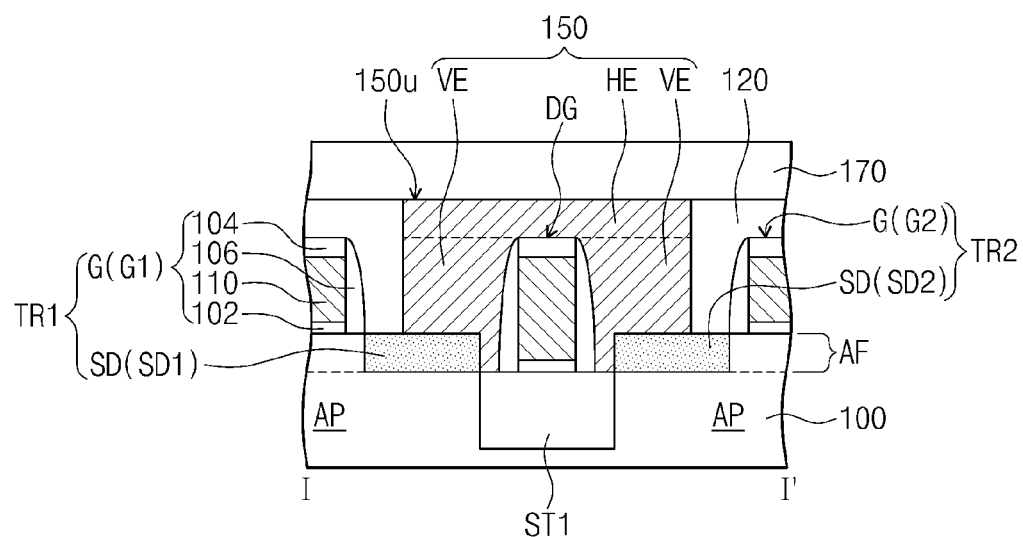
FIGS. 3A, 3B, 3C, and 3D are cross-sectional views taken along lines I-I', II-II', III-III', and IV-IV' of FIG. 2, respectively.
Figure 3B:
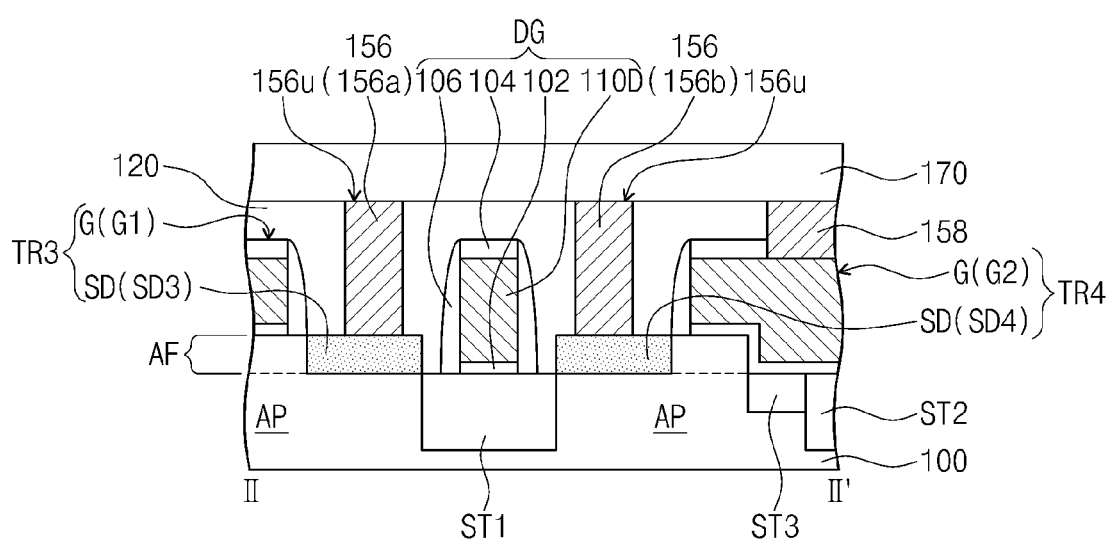
Figure 3C:
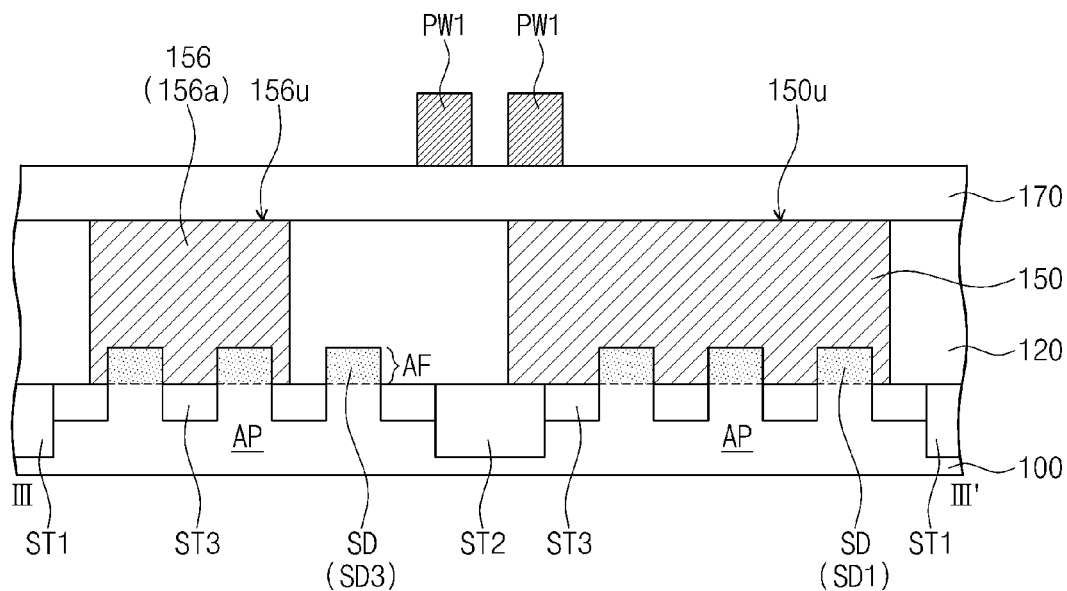

Referring to FIG. 3C, the first logic cell C1 may include a plurality of active patterns AP that are provided on the substrate 100 to extend in the second direction D2. The active patterns AP may be arranged along the first direction D1. According to some example embodiments, third device isolation layers ST3 extending in the second direction D2 may be disposed at both sides of each of the active patterns AP. In some example embodiments, each of the active patterns AP may have an upper portion (hereinafter, referred to as 'an active fin AF') exposed by the third device isolation layers ST3. However, example embodiments of the inventive concepts are not limited thereto. In other example embodiments, top surfaces of the active pattern AP may be substantially coplanar with top surfaces of the third device isolation layers ST3.

The first, second, and third device isolation layers ST1, ST2, and ST3 may have depths in a direction perpendicular to the top surface of the substrate 100. According to some example embodiments, the depths of the third device isolation layers ST3 may be smaller than those of the first and second device isolation layers ST1 and ST2. In this case, the third device isolation layers ST3 may be formed by an additional process different from a process of forming the first and second device isolation layers ST1 and ST2. According to other example embodiments, the third device isolation layers ST3 may be formed simultaneously with the first and second device isolation layers ST1 and ST2. In this case, the depths of the third device isolation layers ST3 may be substantially equal to those of the first and second device isolation layers ST1 and ST2.

The active patterns AP may be provided on each of the PMOSFET region PR and the NMOSFET region NR. As illustrated in FIG. 2, three active patterns AP may be disposed on each of the PMOSFET region PR and the NMOSFET region NR. However, example embodiments of the inventive concepts are not limited thereto.

Referring to FIGS. 3A and 3B, gate structures G may be disposed on the active patterns AP. The gate structures G may extend in the first direction D1 to cross over the active patterns AP. The gate structures G may extend in the first direction D1 to intersect the PMOSFET region PR and the NMOSFET region NR, and may be arranged in the second direction D2. The gate structures G may extend in the first direction D1 to intersect the first logic cell C1 and the third logic cell C3 which are adjacent to each other in the first direction D1. Each of the gate structures G may include a gate insulating pattern 102, a gate electrode 110, and a capping pattern 104 which are sequentially stacked on the substrate 100. The gate insulating pattern 102 may include at least one of a silicon oxide layer, a silicon oxynitride layer, or a high-k dielectric layer of which a dielectric constant is higher than that of a silicon oxide layer. The gate electrode 110 may include at least one of a doped semiconductor, a metal, or a conductive metal nitride. The capping pattern 104 may include at least one of a silicon oxide layer, a silicon nitride layer, or a silicon oxynitride layer. Each of the gate structures G may further include gate spacers 106 that are provided on both sidewalls of the gate electrode 110. The gate spacers 106 may include at least one of a silicon oxide layer, a silicon nitride layer, or a silicon oxynitride layer.

A dummy gate structure DG may be provided between a pair of gate structures G adjacent to each other. The dummy gate structure DG may extend in the first direction D1. The pair of gate structures G may include a first gate structure G1 disposed at one side of the dummy gate structure DG, and a second gate structure G2 disposed at another side of the dummy gate structure DG. The first gate structure G1 and the second gate structure G2 may be adjacent to each other with the dummy gate structure interposed therebetween.

According to some example embodiments, the dummy gate structure DG may extend in the first direction D1 to intersect the first logic cell C1 and the third logic cell C3, as illustrated in FIG. 2. In other words, the first gate structure G1, the second gate structure G2, and the dummy gate structure DG may intersect two cells C1 and C3 adjacent to each other. In this case, the first gate structure G1, the second gate structure G2, and the dummy gate structure DG may intersect the cell boundary CB between the two cells C1 and C3.

According to other example embodiments, the dummy gate structure DG may be provided between the first logic cell C1 and the second logic cell C2 adjacent to the first logic cell C1 in the second direction D2, as illustrated in FIG. 2. The dummy gate structure DG may extend in the first direction D1, so it may also be disposed between the third logic cell C3 and the fourth logic cell C4. In other words, the dummy gate structure DG may be disposed on the cell boundary CB between the first and second logic cells C1 and C2, and between the third and fourth logic cells C3 and C4. In this case, the first gate structure G1 may intersect the first and third logic cells C1 and C3 adjacent to each other in the first direction D1, and the second gate structure G2 may intersect the second and fourth logic cells C2 and C4 adjacent to each other in the first direction D1.

The dummy gate structure DG may include the same materials as each of the gate structures G. For example, the dummy gate structure DG may include a gate insulating pattern 102, a dummy gate pattern 110D, and a capping pattern 104 which are sequentially stacked on the substrate 100. The dummy gate structure DG may further include gate spacers 106 provided on both sidewalls of the dummy gate pattern 110D. The dummy gate pattern 110D may include at least one of, for example, a doped semiconductor, a metal, or a conductive metal nitride.

Source/drain regions SD may be provided in the active patterns AP at both sides of each of the gate structures G. As illustrated in FIG. 3C, the source/drain regions SD may be confined in the active fins AF. Alternatively, the source/drain regions SD may extend downward between the third device isolation layers ST3. The source/drain regions SD disposed in the PMOSFET region PR may be P-type dopant regions, and the source/drain regions SD disposed in the NMOSFET region NR may be N-type dopant regions. Portions of the active patterns AP (e.g., portions of the active fins AF), which are disposed under and overlap with each of the gate structures G, may be used as channel regions.

As shown in FIG. 3A, the source/drain regions SD may include first source/drain regions SD1 provided at both sides of the first gate structure G1, and second source/drain regions SD2 provided at both sides of the second gate structure G2. A first transistor TR1 may be defined by the first gate structure G1 and the first source/drain regions SD1, and a second transistor TR2 may be defined by the second gate structure G2 and the second source/drain regions SD2. The first transistor TR1 and the second transistor TR2 may be adjacent to each other with the dummy gate structure DG interposed therebetween.

As shown in FIG. 3B, the source/drain regions SD may further include third source/drain regions SD3 and fourth source/drain regions SD4. The third source/drain regions SD3 may be provided at both sides of the first gate structure G1, and may be spaced apart from the first source/drain regions SD1 in the first direction D1. The fourth source/drain regions SD4 may be provided at both sides of the second gate structure G2, and may be spaced apart from the second source/drain regions SD2 in the first direction D1. A third transistor TR3 may be defined by the first gate structure G1 and the third source/drain regions SD3, and a fourth transistor TR4 may be defined by the second gate structure G2 and the fourth source/drain regions SD4. The third transistor TR3 and the fourth transistor TR4 may be adjacent to each other with the dummy gate structure DG interposed therebetween. The third transistor TR3 and the fourth transistor TR4 may be spaced apart from the first transistor TR1 and the second transistor TR2 in the first direction D1, respectively.

As shown in FIG. 2, according to some example embodiments, the first gate structure G1, the second gate structure G2, and the dummy gate structure DG may intersect the two cells C1 and C3 adjacent to each other. In this case, the first and second source/drain regions SD1 and SD2 may be provided in the first logic cell C1, and the third and fourth source/drain regions SD3 and SD4 may be provided in the third logic cell C3. In other words, the first and second transistors TR1 and TR2 may correspond to a first pair of transistors included in the first logic cell C1, and the third and fourth transistors TR3 and TR4 may correspond to a second pair of transistors included in the third logic cell C3. The first pair transistors may be adjacent to the second pair of the transistors with the cell boundary CB, disposed between the two cells C1 and C3, interposed therebetween.

According to other example embodiments, the dummy gate structure DG may be provided on the cell boundary CB between the first logic cell C1 and the second logic cell C2, and between the third logic cell C3 and the fourth logic cell C4. The first gate structure G1 may intersect the first and third logic cells C1 and C3 adjacent to each other in the first direction D1, and the second gate structure G2 may intersect the second and fourth logic cells C2 and C4 adjacent to each other in the first direction D1. In this case, the first source/drain regions SD1 may be provided in the first logic cell C1, and the second source/drain regions SD2 may be provided in the second logic cell C2. The third source/drain regions SD3 may be provided in the third logic cell C3, and the fourth source/drain regions SD4 may be provided in the fourth logic cell C4. In other words, the first, second, third, and fourth transistors TR1, TR2, TR3, and TR4 may be included in the first, second, third, and fourth logic cells C1, C2, C3, and C4, respectively. The first, second, third, and fourth transistors TR1, TR2, TR3, and TR4 may be adjacent to each other with the cell boundary CB, disposed between the first to fourth logic cells C1, C2, C3, and C4, interposed therebetween.

Source/drain contacts 156 may be provided at both sides of each of the gate structures G. The source/drain contacts 156 may be electrically connected to the source/drain regions SD. In some example embodiments, the source/drain contacts 156 may be in direct contact with the source/drain regions SD. At least one of the source/drain contacts 156 may connect a plurality of the source/drain regions SD spaced apart from each other in the first direction D1 to each other. For example, one or more of the source/drain contacts 156 may connect the source/drain regions SD, which are arranged in the first direction D1 in the PMOSFET region PR, to each other. Likewise, one or more of the source/drain contacts 156 may connect the source/drain regions SD, which are arranged in the first direction D1 in the NMOSFET region NR, to each other. Even though not shown in the drawings, one or more of the source/drain contacts 156 may extend on the device isolation layer ST to connect the source/drain region SD of the PMOSFET region PR to the source/drain region SD of the NMOSFET region NR. The source/drain contacts 156 may have various shapes. For example, one or more of the source/drain contacts 156 may have a bar shape extending in the first direction D1 when viewed from a plan view. The source/drain contacts 156 may include at least one of, but not limited to, a doped semiconductor, a metal, a metal silicide, or a conductive metal nitride.

As shown in FIG. 3A, a connection contact 150 may be provided on the dummy gate structure DG. The connection contact 150 may connect the first source/drain region SD1 between the first gate structure G1 and the dummy gate structure DG to the second source/drain region SD2 between the second gate structure G2 and the dummy gate structure DG. The connection contact 150 may include a horizontal extension HE provided on the top surface of the dummy gate structure DG to extend in the second direction D2, and vertical extensions VE extending from the horizontal extension HF to the top surfaces of the first and second source/drain regions SD1 and SD2, respectively. The vertical extensions VE may extend from the horizontal extension HE along both sidewalls of the dummy gate structure DG so as to be connected to the first and second source/drain regions SD1 and SD2, respectively. Bottom surfaces of the vertical extensions VE may be in contact with the first and second source/drain regions SD1 and SD2, respectively. According to some example embodiments, a bottom surface of the horizontal extension HE may be in contact with the top surface of the dummy gate structure DG.

A top surface 150U of the connection contact 150 may be disposed at the substantially same level as top surfaces 156U of the source/drain contacts 156. The connection contact 150 may include the same material as the source/drain contacts 156. For example, the connection contact 150 may include at least one of a doped semiconductor, a metal, a metal silicide, or a conductive metal nitride.

The source/drain contacts 156 may include a first contact 156a connected to the third source/drain region SD3 disposed between the first gate structure G1 and the dummy gate structure DG, and a second contact 156b connected to the fourth source/drain region SD4 disposed between the second gate structure G2 and the dummy gate structure DG. The first contact 156a may be provided between the first gate structure G1 and the dummy gate structure DG, and the second contact 156b may be provided between the second gate structure G2 and the dummy gate structure DG. According to some example embodiments, the first contact 156a and the second contact 156b may have bar shapes extending in the first direction D1. The first contact 156a and the second contact 156b may be adjacent to each other with the dummy gate structure DG interposed therebetween. The first and second contacts 156a and 156b may be spaced apart from the connection contact 150 in the first direction D1.

Referring to FIG. 2, the first contact 156a, the second contact 156b, and the connection contact 150 may have a first width W1, a second width W2, and a third width W3 in the second direction D2, respectively. The first width W1 may be substantially equal to the second width W2. The third width W3 may be greater than a total of the first width W1 and the second width W2.

According to some example embodiments, the first gate structure G1, the second gate structure G2, and the dummy gate structure DG may intersect the two cells C1 and C3 adjacent to each other. In this case, the connection contact 150 may be provided in the first logic cell C1, and the first and second contacts 156a and 156b may be provided in the third logic cell C3. The cell boundary CB between the two cells C1 and C3 may be provided between the connection contact 150 and the first and second contact plugs 156a and 156b adjacent to the connection contact 150.

The connection contact 150 may be connected in common to the first transistor TR1 and the second transistor TR2 which are adjacent to each other with the dummy gate structure DG interposed therebetween. The connection contact 150 may be connected to one terminal of the first transistor TR1 and one terminal of the second transistor TR2. The first and second transistors TR1 and TR2 may be included in the first logic cell C1. The first and second contacts 156a and 156b may be respectively connected to the third transistor TR3 and the fourth transistor TR4 which are adjacent to each other with the dummy gate structure DG interposed therebetween. The first contact 156a may be connected to one terminal of the third transistor TR3, and the second contact 156b may be connected to one terminal of the fourth transistor TR4. The third and fourth transistors TR3 and TR4 may be included in the third logic cell C3.

According to other example embodiments, the dummy gate structure DG may be provided on the cell boundary CB between the first logic cell C1 and the second logic cell C2 and between the third logic cell C3 and the fourth logic cell C4. The first gate structure G1 may intersect the first and third logic cells C1 and C3 adjacent to each other in the first direction D1, and the second gate structure G2 may intersect the second and fourth logic cells C2 and C4 adjacent to each other in the first direction D1. In this case, the connection contact 150 may be shared by the first logic cell C1 and the second logic cell C2 which are adjacent to each other in the second direction D2. In other words, the connection contact 150 may be connected in common to the first transistor TR1 provided in the first logic cell C1 and the second transistor TR2 provided in the second logic cell C2. The connection contact 150 may be connected to one terminal of the first transistor TR1 and one terminal of the second transistor TR2. The first contact 156a may be connected to the third transistor TR3 provided in the third logic cell C3, and the second contact 156b may be connected to the fourth transistor TR4 provided in the fourth logic cell C4. The first contact 156a may be connected to one terminal of the third transistor TR3, and the second contact 156b may be connected to one terminal of the fourth transistor TR4. The cell boundary CB between the first and third logic cells C1 and C3 and between the second and fourth logic cells C2 and C4 may be interposed between the connection contact 150 and the first and second contacts 156a and 156b adjacent to the connection contact 150.

In the event that one dummy gate structure DG is provided between the first and second gate structures G1 and G2 adjacent to each other, contacts may be needed to apply voltages to the source/drain regions SD1 and SD3 between the first gate structure G1 and the dummy gate structure DG and the source/drain regions SD2 and SD4 between the second gate structure G2 and the dummy gate structure DG, respectively. If four contacts respectively connected to the source/drain regions SD1, SD2, SD3, and SD4 are disposed with one dummy gate structure DG interposed therebetween, the four contacts may be formed using photo masks different from each other due to limitation of resolution of a photolithography technique. In this case, a manufacture cost of a semiconductor device may be increased by a plurality of the photo masks.

According to example embodiments of the inventive concepts, as shown in FIGS. 3A and 3B, the first source/drain region SD1 between the first and dummy gate structures G1 and DG and the second source/drain region SD2 between the second and dummy gate structures G2 and DG may be connected in common to the connection contact 150. In addition, the third source/drain region SD3 between the first and dummy gate structures G1 and DG and the fourth source/drain region SD4 between the second and dummy gate structures G2 and DG may be connected to the first contact 156a and the second contact 156b, respectively. In other words, three contacts 150, 156a, and 156b may be used to apply voltages to four source/drain regions SD1, SD2, SD3, and SD4 which are spaced apart from each other with one dummy gate structure DG interposed therebetween. Thus, the number of photo masks used for forming the contacts 150, 156a, and 156b may be reduced, so a manufacture cost of the semiconductor device may be reduced. In addition, the contacts 150, 156a, and 156b may be easily formed using different photo masks.

Gate contacts 158 may be provided on the gate structures G. The gate contacts 158 may be electrically connected to the gate structures G. Each of the gate contacts 158 may be in direct contact with the gate electrode 110 of each of the gate structures G. Top surfaces of the gate contacts 158 may be disposed at the substantially same level as the top surfaces of the connection contact 150 and the source/drain contacts 156. The gate contacts 158 may include the same material as the source/drain contacts 156 and the connection contact 150. For example, the gate contacts 158 may include at least one of a doped semiconductor, a metal, a metal silicide, or a conductive metal nitride. The gate contacts 158 may not be provided on the dummy gate structure DG.

The source/drain contacts 156, the connection contact 150, and the gate contacts 158 may be provided in a first interlayer insulating layer 120. For example, the first interlayer insulating layer 120 may include at least one of a silicon oxide layer and a silicon oxynitride layer. The top surfaces of the source/drain contacts 156, the connection contact 150, and the gate contacts 158 may be substantially coplanar with a top surface of the first interlayer insulating layer 120.

Figure 3D:
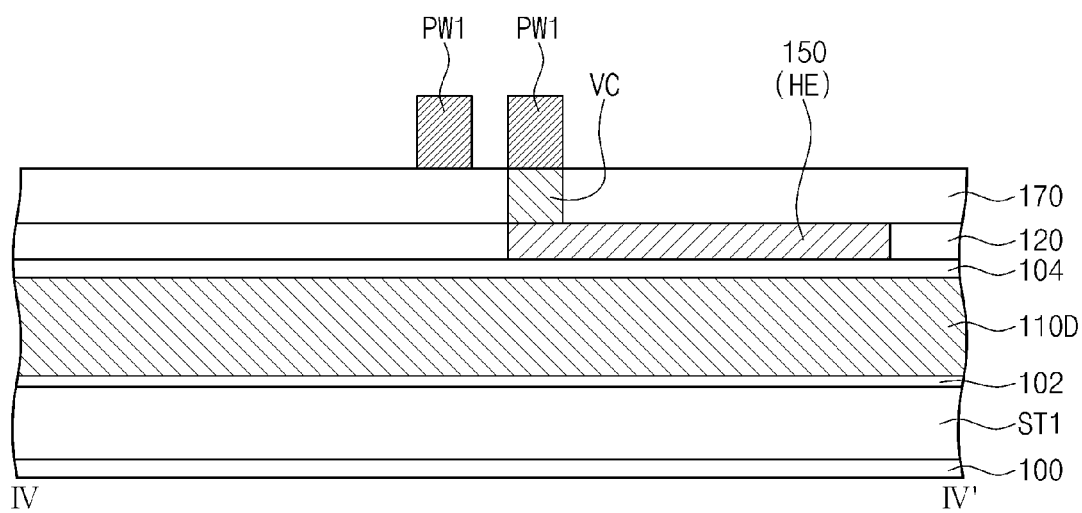
Figure 4A:
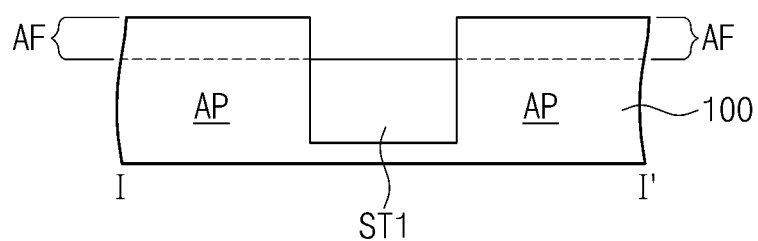
FIGS. 4A, 5A, 6A, 7A and 8A are cross-sectional views corresponding to the line I-I' of FIG. 2 to illustrate a method of manufacturing a semiconductor device according to some example embodiments of the inventive concepts.
Figure 4B:
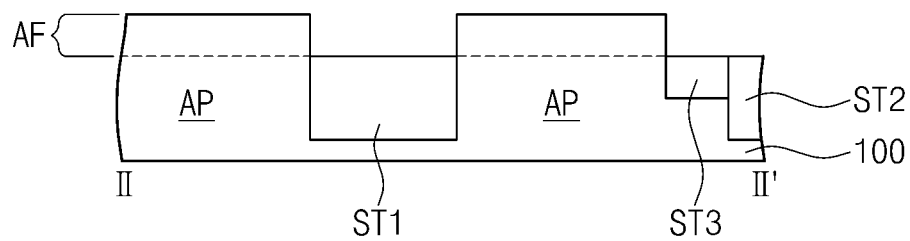
FIGS. 4B, 5B, 6B, 7B and 8B are cross-sectional views corresponding to the line II-II' of FIG. 2 to illustrate a method of manufacturing a semiconductor device according to some example embodiments of the inventive concepts.
Figure 4C:
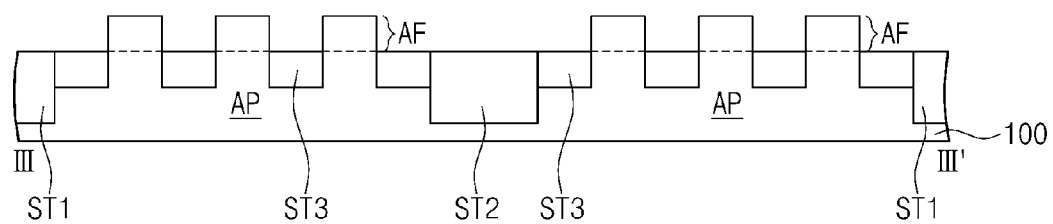
FIGS. 4C, 5C, 6C, 7C and 8C are cross-sectional views corresponding to the line III-III' of FIG. 2 to illustrate a method of manufacturing a semiconductor device according to some example embodiments of the inventive concepts.
Figure 4D:
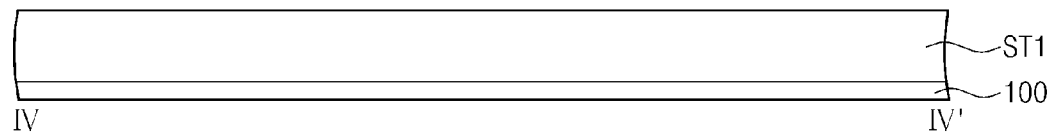
FIGS. 4D, 5D, 6D, 7D and 8D are cross-sectional views corresponding to the line IV-IV' of FIG. 2 to illustrate a method of manufacturing a semiconductor device according to some example embodiments of the inventive concepts.
Figure 5A:
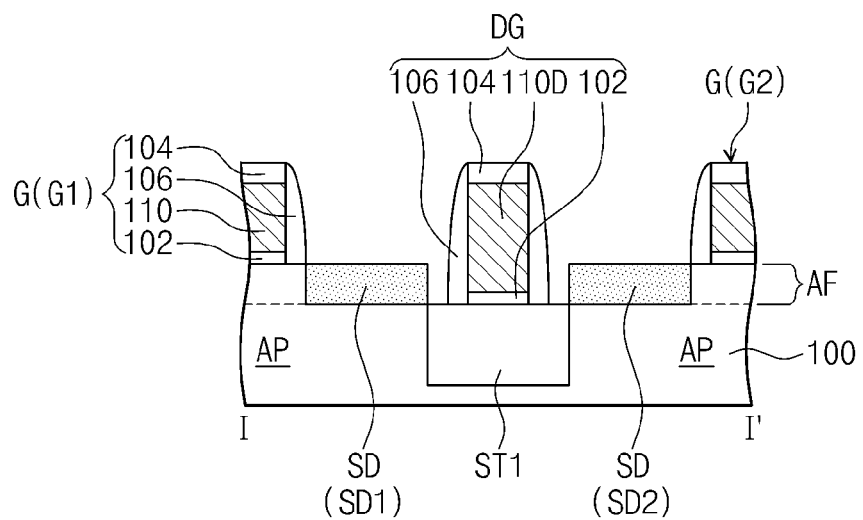
Figure 5B:
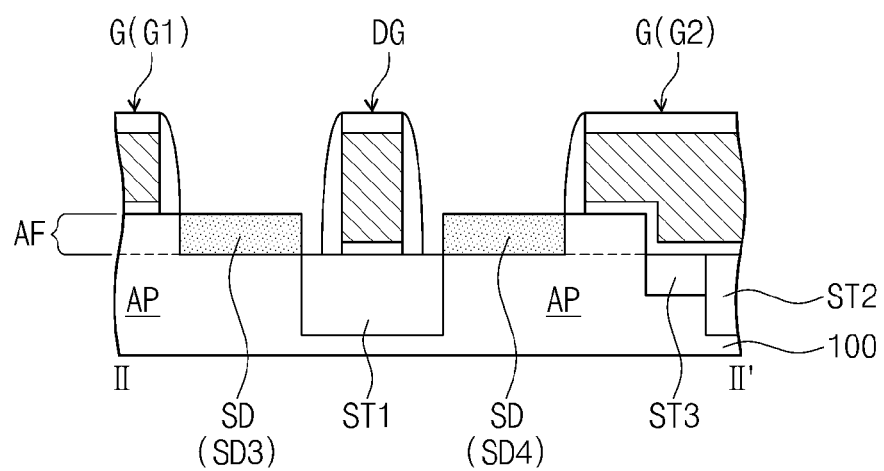
Figure 5C:
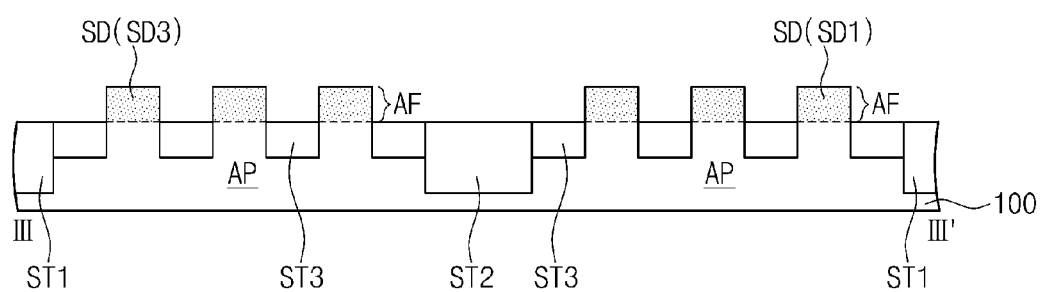
Figure 5D:
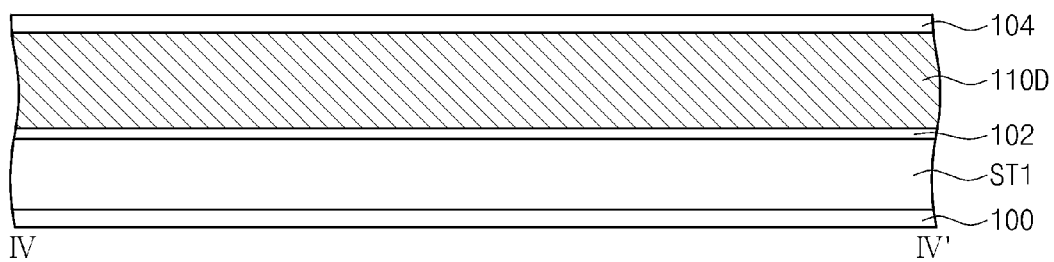
Figure 6A:
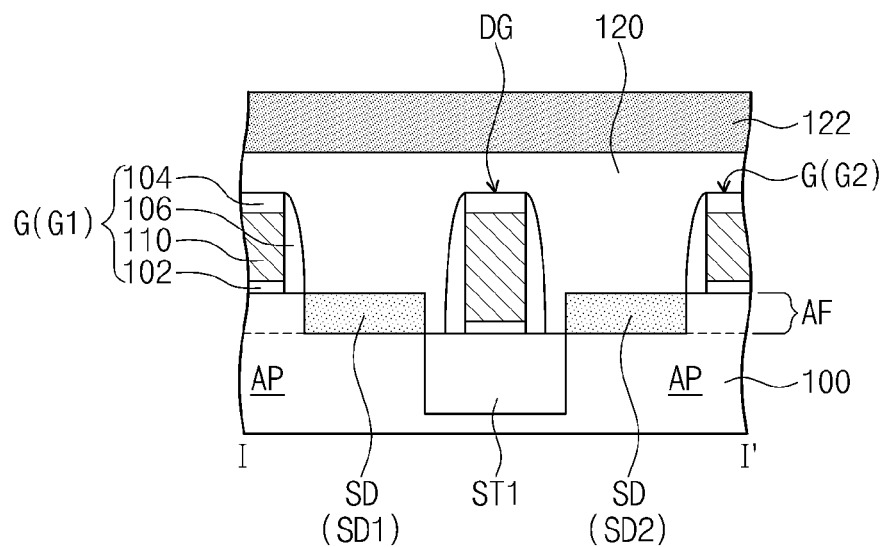
Figure 6B:
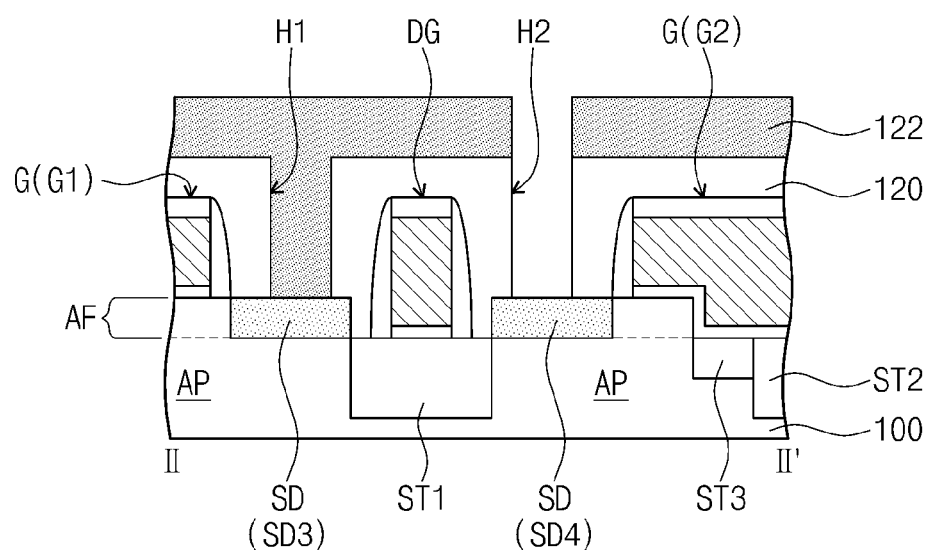
Figure 6C:
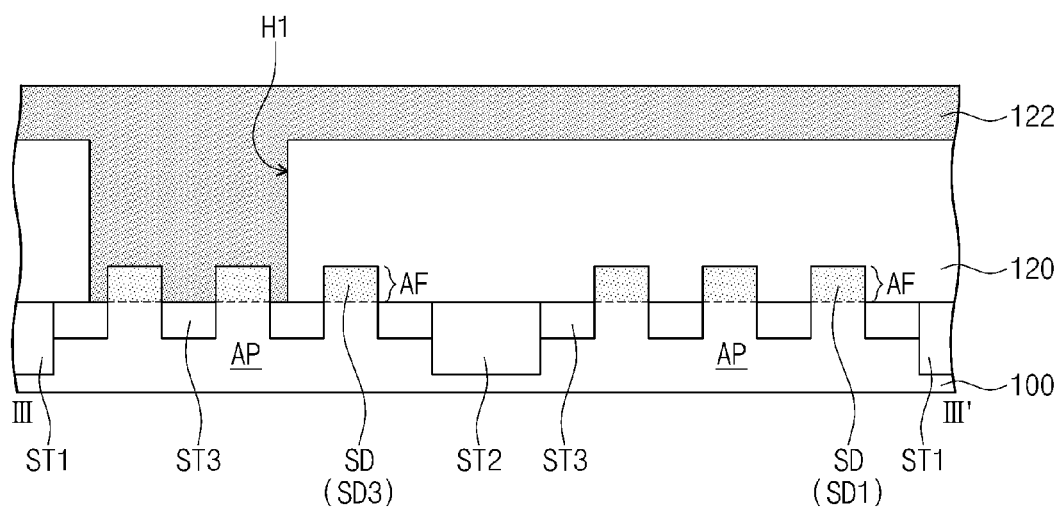
Figure 6D:
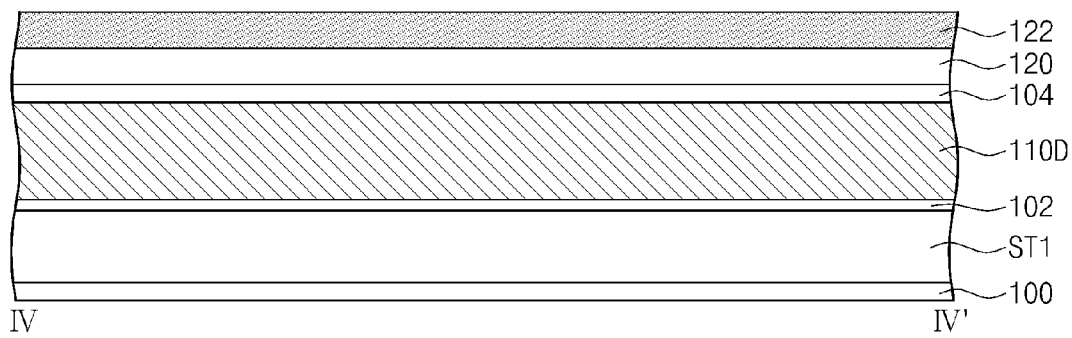
Figure 7A:
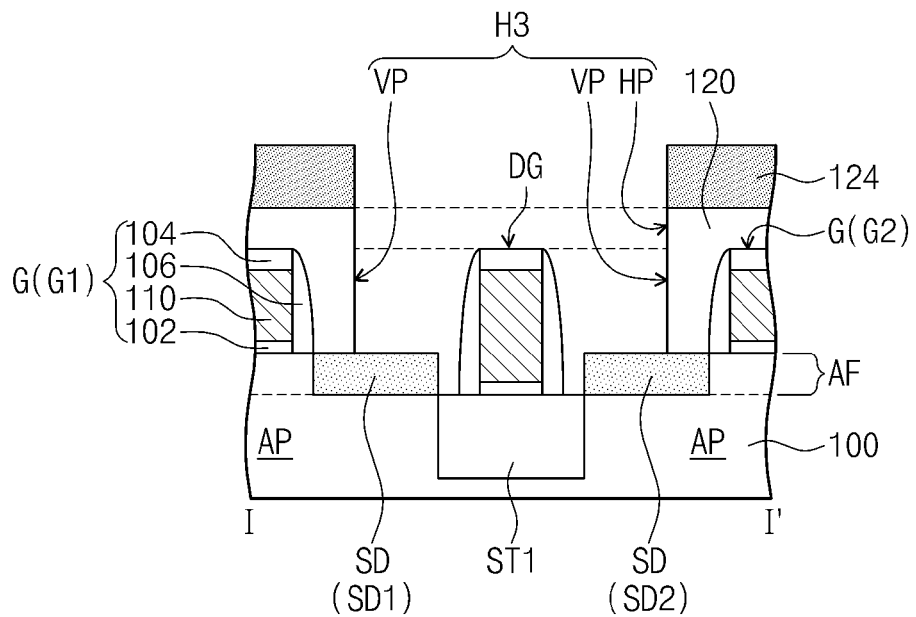
Figure 7B:
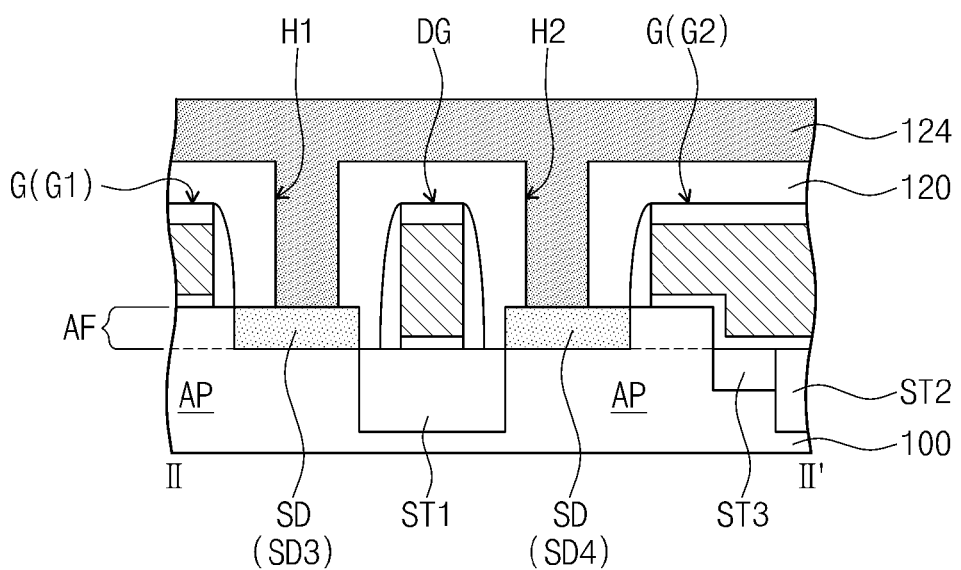
Figure 7C:
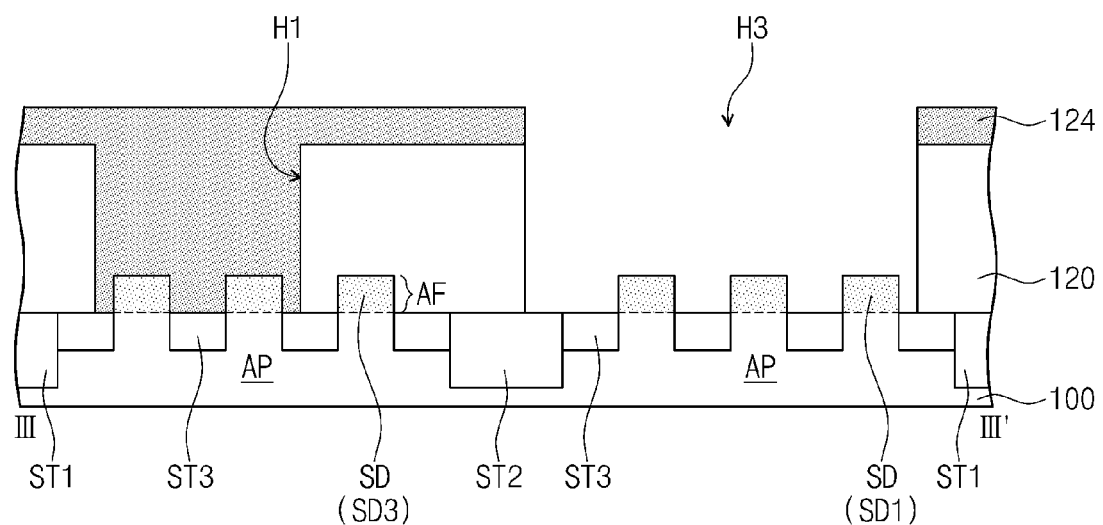
Figure 7D:
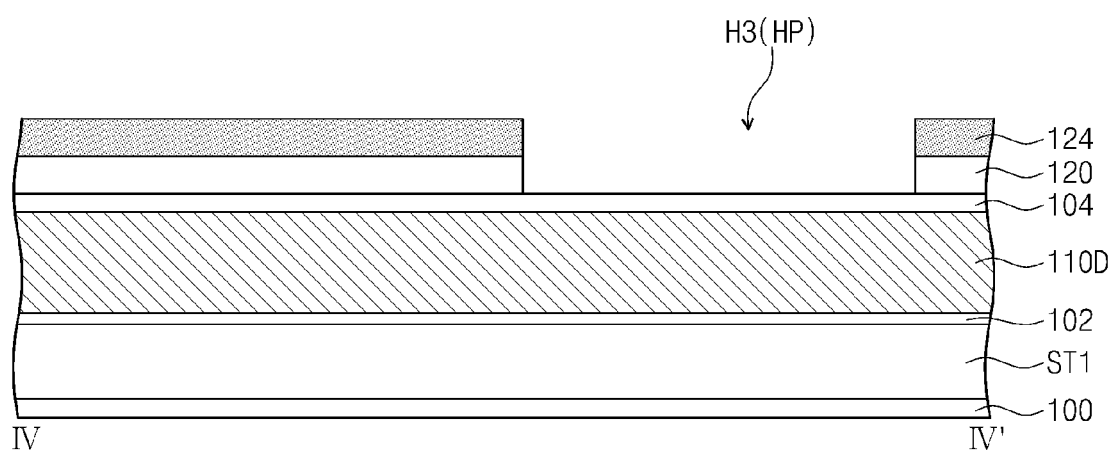
Figure 8A:
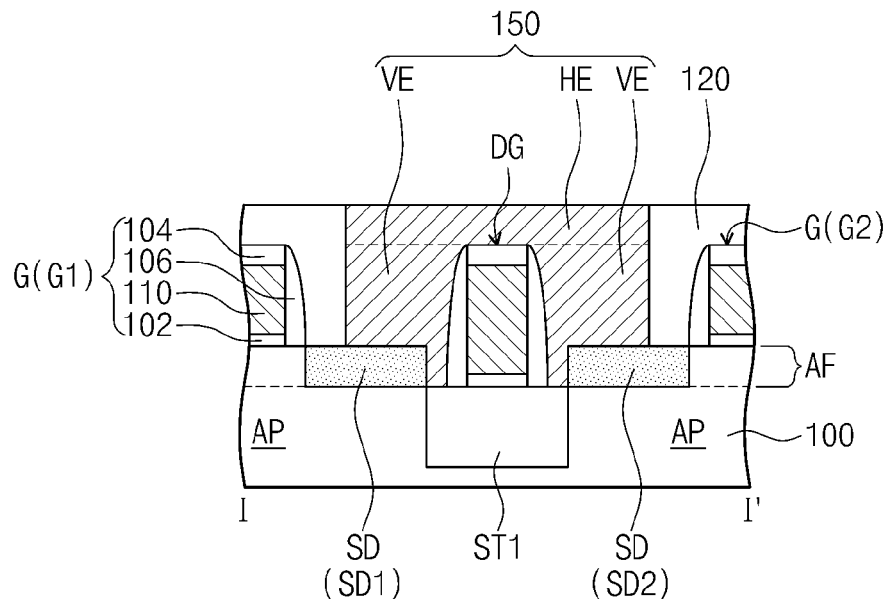
Figure 8B:
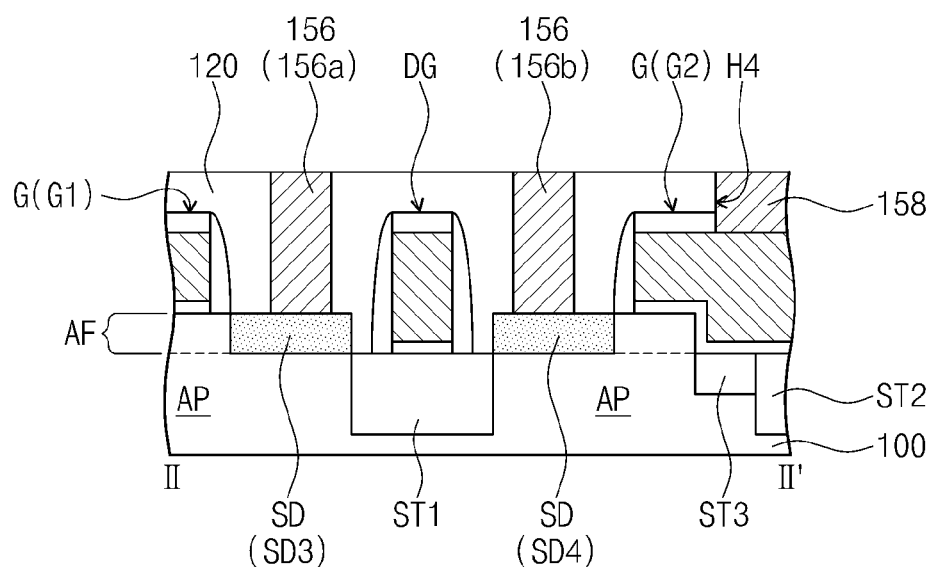
Figure 8C:
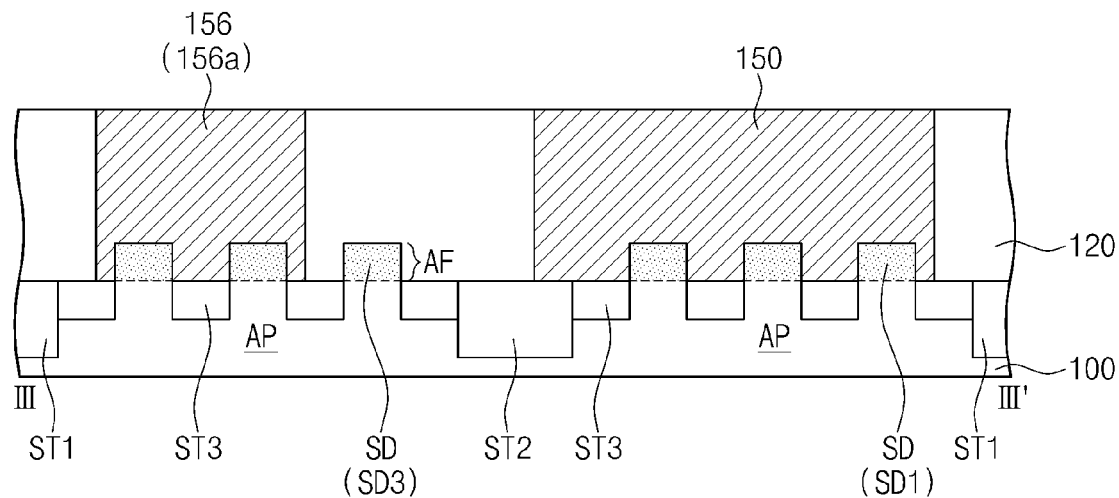
Figure 8D:
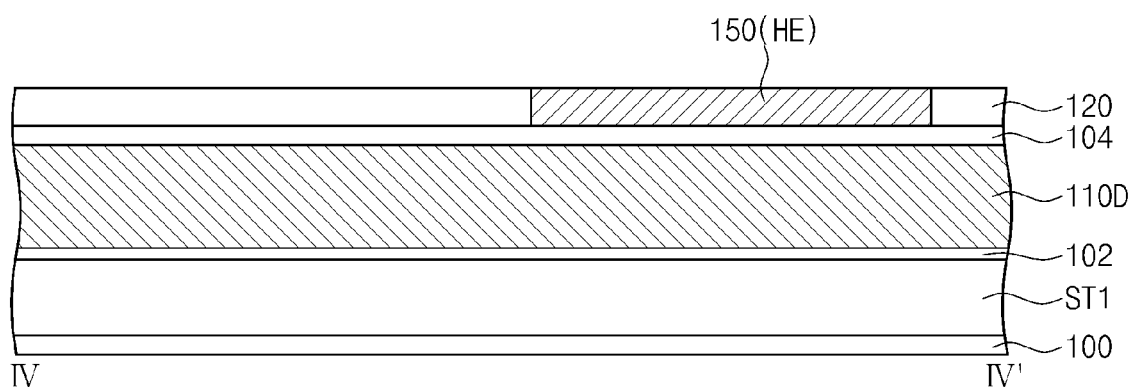

Referring to FIG. 3D, a second interlayer insulating layer 170 may be provided on the first interlayer insulating layer 120. For example, the second interlayer insulating layer 170 may include at least one of a silicon oxide layer and a silicon oxynitride layer. Via-contacts VC may be provided in the second interlayer insulating layer 170. The source/drain contacts 156, the connection contact 150, and the gate contacts 158 may be connected to conductive lines provided on the second interlayer insulating layer 170 through the via-contacts VC corresponding thereto. The conductive lines may include common conductive lines PW1 and PW2, first conductive lines (not shown), and second conductive lines (not shown), which will be described later. The via-contacts VC may include a conductive material. In other example embodiments, the via-contacts VC may be omitted and the conductive lines may be connected directly to the source/drain contacts 156, the connection contact 150, and the gate contacts 158.

Referring to FIG. 2, a first common conductive line PW1 and a second common conductive line PW2 may be provided on the second interlayer insulating layer 170. The first common conductive line PW1 may overlap with the PMOSFET region PR, and the second common conductive line PW2 may overlap with the NMOSFET region NR when viewed from a plan view. The first and second common conductive lines PW1 and PW2 may extend in the second direction D2 and may be spaced apart from each other in the first direction D1. The first and second common conductive lines PW1 and PW2 may be shared by the logic cells C1 and C2 which are adjacent to each other in the second direction D2. In some example embodiments, the first and second common conductive lines PW1 and PW2 may not be shared by the logic cells C1 and C3 which are adjacent to each other in the first direction D1, as illustrated in FIG. 2. However, example embodiments of the inventive concepts are not limited thereto. In other example embodiments, unlike FIG. 2, the first and second common conductive lines PW1 and PW2 may be shared by the logic cells C1 and C3 which are adjacent to each other in the first direction D1. In FIG. 2, the PMOSFET region PR of the first logic cell C1 may be adjacent to the PMOSFET region PR of the third logic cell C3 in the first direction D1. Alternately, the PMOSFET region PR of the first logic cell C1 may be adjacent to the NMOSFET region NR of the third logic cell C3 in the first direction when the first and second common conductive lines PW1 and PW2 are not shared by the logic cells C1 and C3 adjacent to each other in the first direction D1.

The connection contact 150 may be connected to one of the first and second common conductive lines PW1 and PW2. According to an example embodiment, the connection contact 150 may be provided on the PMOSFET region PR so as to be connected to the first common conductive line PW1, as illustrated in FIG. 2. Alternatively, unlike FIG. 2, the connection contact 150 may be provided on the NMOSFET region NR so as to be connected to the second common conductive line PW2.

The connection contact 150 may be connected to one of the first and second common conductive lines PW1 and PW2 through the via-contact VC corresponding to the connection contact 150. In other embodiments, the via-contact VC may be omitted and the connection contact 150 may be connected directly to one of the first and second common conductive lines PW1 and PW2.

According to an example embodiment, the first common conductive line PW1 may provide a drain voltage (Vdd; e.g., a power voltage) to the source/drain regions SD through the via-contact VC and the connection contact 150 in the PMOSFET region PR. In more detail, the first common conductive line PW1 may apply the same drain voltage to the first and second source/drain regions SD1 and SD2 which are connected in common to the connection contact 150. In other words, the first common conductive line PW1 may apply the same drain voltage to the first and second transistors TR1 and TR2 sharing the connection contact 150. In other example embodiments, unlike FIG. 2, the second common conductive line PW2 may provide a source voltage (Vss; e.g., a ground voltage) to the source/drain regions SD through the via-contact VC and the connection contact 150 in the NMOSFET region NR. In more detail, the second common conductive line PW2 may apply the same ground voltage to the first and second source/drain regions SD1 and SD2 which are connected in common to the connection contact 150. In other words, the second common conductive line PW2 may apply the same ground voltage to the first and second transistors TR1 and TR2 sharing the connection contact 150.

At least one of the source/drain contacts 156 may be connected to the first common conductive line PW1 or the second common conductive line PW2. According to an example embodiment, at least one of the source/drain contacts 156 may be provided on the NMOSFET region NR so as to be connected to the second common conductive line PW2. Alternatively, at least one of the source/drain contacts 156 may be provided on the PMOSFET region PR so as to be connected to the first common conductive line PW1.

At least one of the source/drain contacts 156 may be connected to the first common conductive line PW1 or the second common conductive line PW2 through a corresponding via-contact VC. In other example embodiments, the via-contact VC may be omitted and at least one of the source/drain contacts 156 may be connected directly to the first common conductive line PW1 or the second common conductive line PW2.

The source/drain contacts 156 not connected to the first and second common conductive lines PW1 and PW2 may be connected to first conductive lines (not shown) provided on the second interlayer insulating layer 170. According to an example embodiment, the first and second contacts 156a and 156b may be connected to the first conductive lines. The first conductive lines may be connected to a plurality of source/drain contacts 156. The first conductive lines may apply the same voltage to the source/drain regions SD through the source/drain contacts 156 connected to the first conductive lines. In addition, second conductive lines (not shown) connected to the gate contacts 158 may be provided on the second interlayer insulating layer 170. The second conductive lines may apply a gate voltage to the gate structures G through the gate contacts 158. Positions and the numbers of the first and second conductive lines may be determined depending on a design of the logic cells C1, C2, C3, and C4 performing the Boolean logic function and/or the storage function.

The first and second common conductive lines PW1 and PW2 and the first and second conductive lines may include at least one of a doped semiconductor, a conductive metal nitride, or a metal.

FIGS. 4A to 8A to 8D are cross-sectional views illustrating a method of manufacturing a semiconductor device according to some embodiments of the inventive concepts. FIGS. 4A, 5A, 6A, 7A and 8A are cross-sectional views corresponding to the line I-I' of FIG. 2, and FIGS. 4B, 5B, 6B, 7B and 8B are cross-sectional views corresponding to the line II-II' of FIG. 2. FIGS. 4C, 5C, 6C, 7C and 8C are cross-sectional views corresponding to the line III-III' of FIG. 2, and FIGS. 4D, 5D, 6D, 7D and 8D are cross-sectional views corresponding to the line IV-IV' of FIG. 2.

Referring to FIGS. 2 and 4A to 4D, a first device isolation layer ST1 and a second device isolation layer ST2 may be formed in a substrate 100. For example, the substrate 100 may be a silicon substrate, a germanium substrate, or a silicon-on-insulator (SOI) substrate. The first device isolation layer ST1 may separate a PMOSFET region PR from an NMOSFET region NR in a first logic cell C1. The second device isolation layer ST2 may separate the first logic cell C1 from other cells C2, C3, and C4 adjacent to the first logic cell C1. The first and second device isolation layers ST1 and ST2 may have depths in a direction vertical to a top surface of the substrate 100. The depth of the second device isolation layer ST2 may be substantially equal to, or greater than, the depth of the first device isolation layer ST1. The first and second device isolation layers ST1 and ST2 may be formed by a shallow trench isolation (STI) process.

Third device isolation layers ST3 may be formed in the substrate 100. The third device isolation layers ST3 may extend in the second direction D2 to define active patterns AP in the PMOSFET region PR and the NMOSFET region NR. In some example embodiments, each of the active patterns AP may have an upper portion (hereinafter, referred to as 'an active fin AF') which are exposed by the third device isolation layers ST3. The third device isolation layers ST3 may be formed by a STI process. The third device isolation layers ST3 may have depths in the direction vertical to the top surface of the substrate 100. The depths of the third device isolation layers ST3 may be smaller than those of the first and second device isolation layers ST1 and ST2. In other example embodiments, the first to third device isolation layers ST1, ST2, and ST3 may be formed at the same time to have the depths equal to each other. The first to third device isolation layers ST1, ST2, and ST3 may include, for example, a silicon oxide layer.

Referring to FIGS. 2 and 5A to 5D, gate structures G may be formed on the active patterns AP. The gate structures G may extend in the first direction D1 to intersect the active patterns AP. The gate structures G may extend in the first direction D1 to intersect the PMOSFET region PR and the NMOSFET region NR and may be arranged along the second direction D2. The gate structures G may extend in the first direction D1 to intersect the first and third logic cells C1 and C3 which are adjacent to each other in the first direction D1. Each of the gate structures G may include a gate insulating pattern 102, a gate electrode 110, and a capping pattern 104 which are sequentially stacked on the substrate 100. In some example embodiments, a gate insulating layer, a gate electrode layer, and a capping layer may be sequentially formed on the substrate 100, and a patterning process may be performed on the capping layer, the gate electrode layer, and the gate insulating layer to form the gate insulating pattern 102, the gate electrode 110, and the capping pattern 104. The gate insulating layer, the gate electrode layer, and the capping layer may be formed by a chemical vapor deposition (CVD) process and/or a sputtering process. Each of the gate structures G may further include gate spacers 106 that are provided on both sidewalls of the gate electrode 110. A spacer layer may be deposited to cover the gate electrodes 110, and the deposited spacer layer may be anisotropically etched to form the gate spacers 106.

A dummy gate structure DG may be formed between a pair of gate structures G adjacent to each other. The dummy gate structure DG may extend in the first direction D1. The pair of gate structures G may include a first gate structure G1 disposed at one side of the dummy gate structure DG and a second gate structure G2 disposed at another side of the dummy gate structure DG. The dummy gate structure DG may include the same materials as each of the gate structures G. For example, the dummy gate structure DG may include a gate insulating pattern 102, a dummy gate pattern 110D, and a capping pattern 104 which are sequentially stacked on the substrate 100. The dummy gate structure DG may further include gate spacers 106 provided on both sidewalls of the dummy gate pattern 110D. The dummy gate structure DG may be formed by the substantially same process as the gate structures G. The dummy gate structure DG may be formed simultaneously with the gate structures G.

Ion implantation processes may be performed on the substrate having the gate structures G and the dummy gate structure DG to form source/drain regions SD. The source/ drain regions SD may be formed in the active patterns AP at both sides of each of the gate electrodes G. The source/drain regions SD may not be formed in portions of the active patterns AP that are disposed under the gate structures G to overlap with the gate structures G. In the PMOSFET region PR, the source/drain regions SD may be formed by implanting P-type dopant ions. In the NMOSFET regions NR, the source/drain regions SD may be formed by implanting N-type dopant ions.

The source/drain regions SD may include first source/drain regions SD1 provided at both sides of the first gate structure G1 and second source/drain regions SD2 provided at both sides of the second gate structure G2. The source/drain regions SD may further include third source/drain regions SD3 provided at both sides of the first gate structure G1 and fourth source/drain regions SD4 provided at both sides of the second gate structure G2. The third source/drain regions SD3 may be spaced apart from the first source/drain regions SD1 in the first direction D1, and the fourth source/drain regions SD4 may be spaced apart from the second source/drain regions SD2 in the first direction D1.

Referring to FIGS. 2 and 6A to 6D, a first interlayer insulating layer 120 may be formed on the substrate 100 to cover the gate structures G and the dummy gate structure DG. The first interlayer insulating layer 120 may include at least one of a silicon oxide layer or a silicon oxynitride layer.

A first hole H1 may be formed to penetrate the first interlayer insulating layer 120. The first hole H1 may expose the third source/drain region SD3 between the first gate structure G1 and the dummy gate structure DG. The first hole H1 may have a groove shape extending in the first direction D1. Forming the first hole H1 may include patterning the first interlayer insulating layer 120 using a first photo mask defining the first hole H1. After the formation of the first hole H1, a first sacrificial layer 122 filling the first hole H1 may be formed on the first interlayer insulating layer 120. The first sacrificial layer 122 may include, for example, a spin-on-hardmask (SOH) material.

After the formation of the first sacrificial layer 122, a second hole H2 may be formed to penetrate the first sacrificial layer 122 and the first interlayer insulating layer 120. The second hole H2 may expose the fourth source/drain region SD4 between the second gate structure G2 and the dummy gate structure DG. The second hole H2 may have a groove shape extending in the first direction D1. Forming the second hole H2 may include patterning the first sacrificial layer 122 and the first interlayer insulating layer 120 using a second photo mask defining the second hole H2.

Referring to FIGS. 2 and 7A to 7D, the first sacrificial layer 122 may be removed. The removal of the first sacrificial 122 may be performed using an ashing process and/or a strip process. After the removal of the first sacrificial layer 122, a second sacrificial layer 124 may be formed on the first interlayer insulating layer 120 to fill the first and second holes H1 and H2. The second sacrificial layer 124 may include, for example, a SOH material. In some example embodiments, the first sacrificial layer 122 may not be removed before the formation of the second sacrificial layer 124. In this case, the second sacrificial layer 124 may be formed on the first sacrificial layer 122 to fill the second hole H2.

After the formation of the second sacrificial layer 124, a third hole H3 may be formed to expose the first source/drain region SD1 between the first gate structure G1 and the dummy gate structure DG, the second source/drain region SD2 between the second gate structure G2 and the dummy gate structure DG, and a top surface of the dummy gate structure DG. The third hole H3 may include a horizontal through-portion HP extending in the second direction D2, and vertical through-portions VP extending from the horizontal through-portion HP toward the top surface of the substrate 100. The vertical through-portions VP may expose the first source/drain region SD1 and the second source/drain region SD2, respectively. Forming the third hole H3 may include patterning the second sacrificial layer 124 and the first interlayer insulating layer 120 using a third photo mask defining the third hole H3. The first, second, and third holes H1, H2, and H3 may be formed using different photo masks from each other, and a formation order of the first to third holes H1, H2, and H3 may not be limited to the above descriptions. In other example embodiments, the third hole H3 may be formed before the formation of the first and second holes H1 and H2. Additional holes (not shown) may be formed in the first interlayer insulating layer 120 to expose the source/drain regions SD except the first to fourth source/drain regions SD1, SD2, SD3 and SD4. One or more of the additional holes may be formed using the same photo mask with the first hole H1. One or more of the additional holes may be formed using the same photo mask with the second hole H2. One or more of the additional holes may be formed using the same photo mask with the third hole H3.

Referring to FIGS. 2 and 8A to 8D, the second sacrificial layer 124 may be removed. The removal of the second sacrificial layer 124 may be performed using an ashing process and/or a strip process. After the removal of the second sacrificial layer 124, a third sacrificial layer (not shown) may be formed on the first interlayer insulating layer 120 to cover the first to third holes H1, H2, and H3 and the additional holes. The third sacrificial layer may include, for example, a SOH material. After the formation of the third sacrificial layer, fourth holes H4 may be formed to penetrate the third sacrificial layer and the first interlayer insulating layer 120. The fourth holes H4 may expose the gate electrodes 110 of the gate structures G, respectively. Thereafter, the third sacrificial layer may be removed. The third sacrificial layer may be removed by an ashing process and/or a strip process.

A conductive layer may be formed on the first interlayer insulating layer 120 to fill the first to fourth holes H1, H2, H3, and H4 and the additional holes. For example, the conductive layer may include a doped semiconductor, a metal, a metal silicide, or a conductive metal nitride. The conductive layer may be planarized until the first interlayer insulating layer 120 is exposed, thereby forming source/drain contacts 156 in the first and second holes H1 and H2 and the additional holes, a connection contact 150 in the third hole H3, and gate contacts 158 in the fourth holes H4. The source/drain contacts 156 may include a first contact 156a provided in the first hole H1 and a second contact 156b provided in the second hole H2. The connection contact 150 may include a horizontal extension HE provided on the top surface of the dummy gate structure DG to extend in the second direction D2, and vertical extensions VE extending from the horizontal extension HE to top surfaces of the first and second source/drain regions SD1 and SD2, respectively. According to an example embodiment, the gate contacts 158 may be formed simultaneously with the source/drain contacts 156 and the connection contact 150. Due to the planarization process, top surfaces of the source/drain contacts 156, the connection contact 150, and the gate contacts 158 may be disposed at the substantially same level.

Referring again to FIGS. 2 and 3A to 3D, a second interlayer insulating layer 170 may be formed on the resultant structure having the source/drain contacts 156, the connection contact 150, and the gate contacts 158. For example, the second interlayer insulating layer 170 may include at least one of a silicon oxide layer and a silicon oxynitride layer. Via-contacts VC may be formed in the second interlayer insulating layer 170. The via-contacts VC may be formed to correspond to the source/drain contacts 156, the connection contact 150, and the gate contacts 158, respectively.

First and second common conductive lines PW1 and PW2 may be formed on the second interlayer insulating layer 170. The first and second common conductive lines PW1 and PW2 may extend in the second direction D2 and may be spaced apart from each other in the first direction D1. The first and second common conductive lines PW1 and PW2 may be shared by the logic cells C1 and C2 adjacent to each other in the second direction D2. The connection contact 150 may be connected to one of the first and second common conductive lines PW1 and PW2 through the via-contact VC corresponding to the connection contact 150. First conductive lines (not shown) connected to the source/drain contacts 156 and second conductive lines (not shown) connected to the gate contacts 158 may be formed on the second interlayer insulating layer 170. The first and second contacts 156a and 156b may be connected to the first conductive lines through the via-contacts VC corresponding to the first and second contacts 156a and 156b. The gate contacts 158 may be connected to the second conductive lines through the via-contacts VC corresponding to the gate contacts 158. The first and second common conductive lines PW1 and PW2 and the first and second conductive lines may include at least one of a doped semiconductor, a conductive metal nitride, or a metal.

According to some example embodiments of the inventive concepts, three contacts 150, 156a, and 156b may be formed to apply voltages to four source/drain regions SD1, SD2, SD3, and SD4 which are spaced apart from each other with one dummy gate structure DG interposed therebetween. Thus, the number of the photo masks used for forming the contacts 150, 156a, and 156b may be reduced. This means that the manufacture cost of the semiconductor device may be reduced.

In the above example embodiments, the active patterns AP may have fin shapes. However, example embodiments of the inventive concepts are not limited thereto. The shapes of the active patterns AP may be variously modified.

Figure 9:
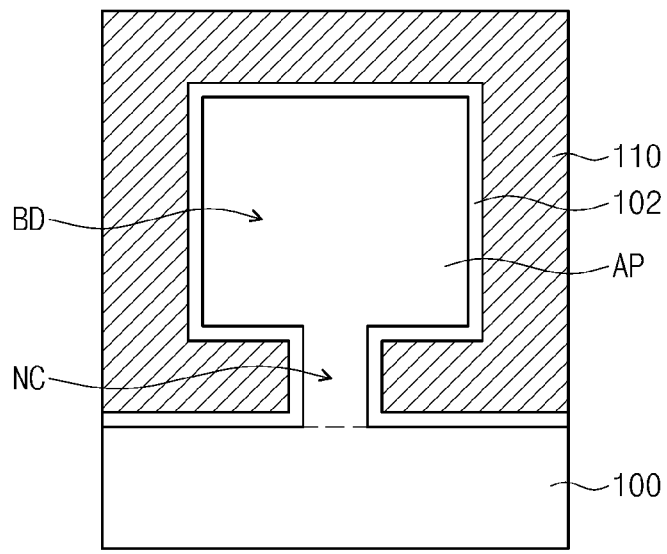
FIG. 9 is a conceptual diagram illustrating an active pattern of a semiconductor device according to some example embodiments of the inventive concepts.

FIG. 9 is a conceptual diagram illustrating an active pattern of a semiconductor device according to other example embodiments of the inventive concepts.

In the present example embodiments, a cross section of an active pattern AP may have an omega shape that includes a neck portion NC adjacent to a substrate 100 and a body portion BD having a width wider than that of the neck portion NC. A gate insulating pattern 102 and a gate electrode 110 may be sequentially provided on the active pattern AP. A portion of the gate electrode 110 may extend under the body portion BD of the active pattern AP.

Figure 10:
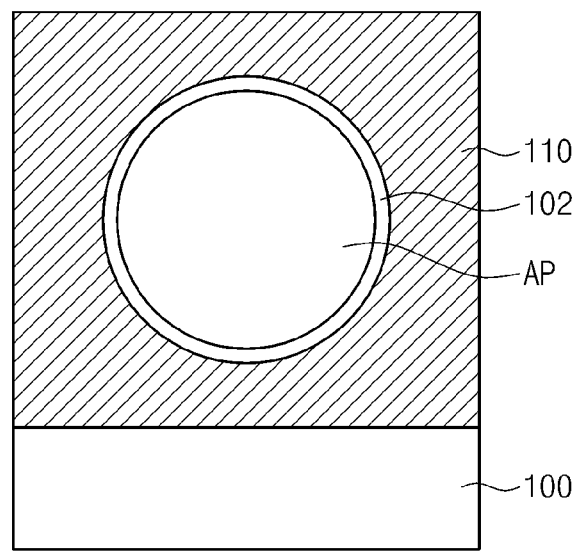
FIG. 10 is a conceptual diagram illustrating an active pattern of a semiconductor device according to still other example embodiments of the inventive concepts.

FIG. 10 is a conceptual diagram illustrating an active pattern of a semiconductor device according to still other example embodiments of the inventive concepts.

In the present example embodiments, an active pattern AP may have a nano-wire shape spaced apart from a substrate 100. A gate insulating pattern 102 and a gate electrode 110 may be sequentially provided on the active pattern AP. The gate electrode 110 may extend between the active pattern AP and the substrate 100.

Figure 11:
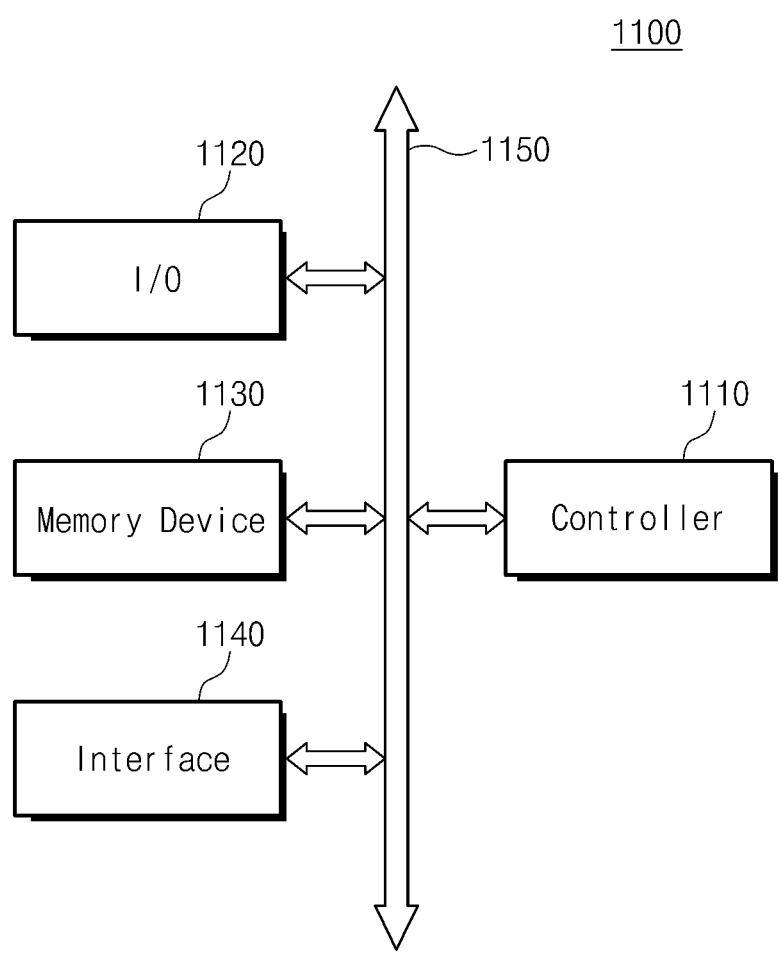
FIG. 11 is a schematic block diagram illustrating an electronic system including a semiconductor device according to some example embodiments of the inventive concepts.

FIG. 11 is a schematic block diagram illustrating an electronic system including a semiconductor device according to some example embodiments of the inventive concepts.

Referring to FIG. 11, an electronic system 1100 according to some example embodiments of the inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or a cable. For example, the interface unit 1140 may include an antenna or a wireless/cable transceiver. Although not shown in the drawings, the electronic system 1100 may further include a fast dynamic random access memory (DRAM) device and/or a fast static random access memory (SRAM) device which acts as a cache memory for improving an operation of the controller 1110. At least one of the semiconductor devices according to the aforementioned example embodiments of the inventive concepts may be provided in the memory device 1130, the controller 1110, and/or the I/O unit 1120.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

According to example embodiments of the inventive concepts, three contacts may be formed to apply voltages to four source/drain regions which are spaced apart from each other with one dummy gate structure interposed therebetween. Thus, the number of photo masks used in processes of forming the contacts may be reduced. This means that the manufacture cost of the semiconductor device may be reduced. In addition, the contacts may be easily formed using different photo masks from each other.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device, comprising:
    a device isolation layer on a substrate and defining an active pattern, the active pattern protruding upwardly from the substrate, extending in a first direction, and comprising an active fin, wherein the active fin is an upper portion of the active pattern, which is exposed by the device isolation layer;
    a first gate structure and a second gate structure crossing the active pattern, extending in a second direction intersecting the first direction and spaced apart from each other in the first direction;
a dummy gate structure between the first gate structure and the second gate structure, the dummy gate structure extending in the second direction;
a first source/drain region on the active pattern between the first gate structure and the dummy gate structure;
a second source/drain region on the active pattern between the second gate structure and the dummy gate structure;
a connection contact on the dummy gate structure, the connection contact extending in the first direction to connect the first source/drain region to the second source/drain region; and
a common conductive line on the connection contact, the common conductive line configured to apply a voltage to the first and second source/drain regions through the connection contact.

2. The semiconductor device of claim 1, wherein the device isolation layer exposes sidewalls of the active fin, and each of the first gate structure and the second gate structure cover the sidewalls of the active fin.

3. The semiconductor device of claim 2, wherein each of the first gate structure and the second gate structure cover an upper surface of the active fin and the sidewalls of the active fin, and extend onto an upper surface of the device isolation layer.

4. The semiconductor device of claim 1, wherein a level of an uppermost surface of the active fin is higher than that of an uppermost surface of the device isolation layer from the substrate.

5. The semiconductor device of claim 1, wherein
the connection contact comprises:
a horizontal extension extending in the first direction; and
vertical extensions extending from the horizontal extension to top surfaces of the first and second source/drain regions, respectively, and
bottom surfaces of the vertical extensions are in contact with the first and second source/drain regions, respectively.

6. The semiconductor device of claim 5, wherein a bottom surface of the horizontal extension is in contact with a top surface of the dummy gate structure.

7. The semiconductor device of claim 1, wherein the active pattern comprises a first active pattern and a second active pattern which are spaced apart from each other in the second direction, and
wherein each of the first and second gate structures crosses the first and second active patterns, and the first and second source/drain regions are on the first active pattern,
The device further comprising:
a third source/drain region on the second active pattern between the first gate structure and the dummy gate structure, the third source/drain region being spaced apart from the first source/drain region in the second direction;
a fourth source/drain region on the second active pattern between the second gate structure and the dummy gate structure, the fourth source/drain region being spaced apart from the second source/drain region in the second direction;
a first contact between the first gate structure and the dummy gate structure, the first contact being in contact with the third source/drain region; and
a second contact between the second gate structure and the dummy gate structure, the second contact being in contact with the fourth source/drain region,
top surfaces of the first and second contacts being at a substantially same level as a top surface of the connection contact.

8. The semiconductor device of claim 7, wherein the first contact, the second contact, and the connection contact include the same materials each other.

9. The semiconductor device of claim 7, wherein
the first and second contacts have bar shapes extending in the second direction, and
the first and second contacts are spaced apart from the connection contact in the second direction.

10. The semiconductor device of claim 7, wherein
each of the first contact, the second contact, and the connection contact has a width in the first direction when viewed in a plane view, and
the width of the connection contact is greater than the widths of the first and second contacts.

11. The semiconductor device of claim 7, further comprising:
a plurality of logic cells on the substrate, the plurality of logic cells including,
a first logic cell, and
a second logic cell spaced apart from the first logic cell in the second direction,
each of the first gate structure, the second gate structure, and the dummy gate structure intersecting the first logic cell and the second logic cell,
the first logic cell including the first and second source/drain regions on the first active pattern, and
the second logic cell including the third and fourth source/drain regions on the second active pattern.

12. The semiconductor device of claim 11, further comprising:
a via-contact in contact with the top surface of the connection contact,
wherein the common conductive line is in contact with a top surface of the via-contact, and
the common conductive line is configured to apply a drain voltage or a source voltage to the first and second source/drain regions through the via-contact and the connection contact.

13. The semiconductor device of claim 7, further comprising:
a plurality of logic cells on the substrate, the plurality of logic cells including,
a first logic cell,
a second logic cell spaced apart from a first logic cell in the first direction,
a third logic cell spaced apart from the first logic cell in the second direction, and
a fourth logic cell spaced apart from the second logic cell in the second direction,
the first gate structure intersecting the first logic cell and the third logic cell,
the second gate structure intersecting the second logic cell and the fourth logic cell
the dummy gate structure being between the first logic cell and the second logic cell and between the third logic cell and the fourth logic cell,
the first logic cell including the first source/drain region on the first active pattern,
the second logic cell including the second source/drain region on the first active pattern, the third logic cell including the third source/drain region on the second active pattern, and the fourth logic cell including the fourth source/drain region on the second active pattern.

14. The semiconductor device of claim 13, further comprising:

a via-contact in contact with the top surface of the connection contact, wherein the common conductive line is in contact with a top surface of the via-contact, and the common conductive line being shared by the first logic cell and the second logic cell.

15. The semiconductor device of claim 14, wherein the common conductive line applies the same voltage to the first and second source/drain regions through the via-contact and the connection contact.

16. The semiconductor device of claim 1, wherein the device isolation layer is a first device isolation layer, The device further comprising:

a second device isolation layer extending in the second direction and dividing the active pattern into a pair of active patterns spaced apart from each other in the first direction, wherein the first gate structure and the second gate structure cross the pair of active patterns, respectively, and the dummy gate structure is disposed on the second device isolation layer between the pair of active patterns.

17. The semiconductor device of claim 16, wherein each of the pair of active patterns comprises the active fin, and wherein the first device isolation layer exposes sidewalls of the active fin, and each of the first gate structure and the second gate structure cover the sidewalls of the active fin.

18. The semiconductor device of claim 17, wherein each of the first gate structure and the second gate structure cover an upper surface of the active fin and the sidewalls of the active fin, and extend onto an upper surface of the first device isolation layer.

19. The semiconductor device of claim 16, wherein the dummy gate structure extends along the upper surface of the second device isolation layer between the pair of active patterns.

20. The semiconductor device of claim 16, wherein the dummy gate structure is spaced apart from at least one of the pair of active patterns.

* * * * *